(12) United States Patent
Yun et al.

(10) Patent No.: US 7,365,909 B2
(45) Date of Patent: Apr. 29, 2008

(54) FABRICATION METHODS FOR MICRO COMPOUNDS OPTICS

(75) Inventors: Wenbing Yun, Walnut Creek, CA (US); Yuxin Wang, Arlington Heights, IL (US); Michael Feser, Walnut Creek, CA (US); Alan Lyon, Berkeley, CA (US)

(73) Assignee: Xradia, Inc., Concord, CA (US)

( * ) Notice: Subject to any disclaimer, the term of this patent is extended or adjusted under 35 U.S.C. 154(b) by 0 days.

(21) Appl. No.: 10/688,187

(22) Filed: Oct. 17, 2003

(65) Prior Publication Data
US 2004/0130785 A1 Jul. 8, 2004

Related U.S. Application Data

(60) Provisional application No. 60/419,331, filed on Oct. 17, 2002.

(51) Int. Cl.
*G02B 27/44* (2006.01)
(52) U.S. Cl. ............... 359/565; 359/742; 359/355; 216/26; 257/797; 438/975
(58) Field of Classification Search ............ 359/565
See application file for complete search history.

(56) References Cited

U.S. PATENT DOCUMENTS 6,269,145 B1 * 7/2001 Piestrup et al. ............... 378/81
2004/0125442 A1 * 7/2004 Yun et al. .................... 359/386

* cited by examiner

*Primary Examiner*—Arnel Lavarias
(74) *Attorney, Agent, or Firm*—Houston Eliseeva LLP

(57) ABSTRACT

Methods for fabricating refractive element(s) and aligning the elements in a compound optic, typically to a zone plate element. The techniques are used for fabricating micro refractive, such as Fresnel, optics and compound optics including two or more optical elements for short wavelength radiation. One application is the fabrication of the Achromatic Fresnel Optic (AFO). Techniques for fabricating the refractive element generally include: 1) ultra-high precision mechanical machining, e.g,. diamond turning; 2) lithographic techniques including gray-scale lithography and multi-step lithographic processes; 3) high-energy beam machining, such as electron-beam, focused ion beam, laser, and plasma-beam machining; and 4) photo-induced chemical etching techniques. Also addressed are methods of aligning the two optical elements during fabrication and methods of maintaining the alignment during subsequent operation.

28 Claims, 8 Drawing Sheets

COMPLETED FRESNEL LENS PROFILE

COMPLETED FRESNEL LENS PROFILE

SUBSTRATE THINNED (IF NECESSARY) TO INCREASE TRANSMISSION

AFO WITH ZONE PLATE FABRICATED

FABRICATION METHODS FOR MICRO COMPOUNDS OPTICS

RELATED APPLICATIONS

This application claims priority to U.S. Provisional Appl. No. 60/419,331, filed Oct. 17, 2002, which is incorporated herein by reference in its entirety.

BACKGROUND OF THE INVENTION

The present invention pertains generally to fabrication techniques to be used for fabricating micro refractive, such as Fresnel, optics and compound optic comprising two or optical elements for short wavelength radiation. One application is the fabrication of the (AFO) described in U.S. patent application Ser. No. 10/134,026, which is incorporated herein by this reference in its entirety.

The Achromatic Fresnel Optic (AFO) is a multi, such as two, element compound optic that is comprised of a diffractive Fresnel zone plate and a one or more refractive Fresnel lenses. The optic is described in U.S. patent application Ser. No. 10/134,026 (U.S. Pat. Appl. Publ. No. US 2005/0168820 A1), which is incorporated herein by this reference in its entirety. Further uses for the optic are described in U.S. patent application Ser. No. 10/683,872 filed on Oct. 10, 2003, by Wenbing Yun and Yuxin Wang (U.S. Pat. Appl. Publ. No. US 2004/0165165 A1), which is incorporated herein by this reference in its entirety.

Generally, the AFO is used for imaging short wavelength radiation including extreme ultraviolet (EUV) and x-ray radiation with wavelengths in the range of 0.02 nanometers (nm) to 20 µm. The diffractive element(s) is the primary focusing element, and the refractive element typically provides no or very little net focusing effect. It serves to correct the chromatic aberration of the zone plate.

SUMMARY OF THE INVENTION

The techniques for fabricating the zone plate element are well known in the art. They include, photo and electron-beam lithography techniques, and sputter-slice techniques. Challenges arise, however, when fabricating compound optics and Fresnel refractive optics for these short wavelength radiation applications.

Generally, the present invention describes methods of fabricating the refractive element(s) and aligning the elements in the compound optic and thus to the zone plate element. More specifically, the invention concerns the techniques that are used for fabricating micro refractive, such as Fresnel, optics and compound optics comprising two or optical elements for short wavelength radiation. One application is the fabrication of the Achromatic Fresnel Optic (AFO).

Techniques for fabricating the refractive element generally include: 1) ultra-high precision mechanical machining, e.g., diamond turning; 2) lithographic techniques including gray-scale lithography and multi-step lithographic processes; 3) high-energy beam machining, such as electron-beam, focused ion beam, laser, and plasma-beam machining; and 4) photo-induced chemical etching techniques. Also addressed are methods of aligning the two optical elements during fabrication and methods of maintaining the alignment during subsequent operation.

In general according to one aspect, the invention features a method for fabricating a compound optic for short wavelength radiation. The method comprises removing material of a substrate to form a surface profile of a first optical element of the compound optic. This can be performed mechanically or chemically. The second optical element of the compound optic is also formed on the substrate.

In general according to another aspect, the invention features a method for fabricating a compound optic for short wavelength radiation. The method comprises forming a surface profile of a first optical element of the compound optic on a substrate, while also forming a fiducial mark on the substrate. The second optical element of the compound optic is then formed by reference to the fiducial mark.

In general according to still another aspect, the invention features an optical element for short wavelength radiation. The element comprises concentric rings for focusing a beam of short wavelength radiation and segments extending at least partially radially between the concentric rings to support the rings.

A frame is also preferably provided. It extends around at least a portion of a perimeter of the concentric rings, with the segments extending between the rings and the frame to support the rings in the frame.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
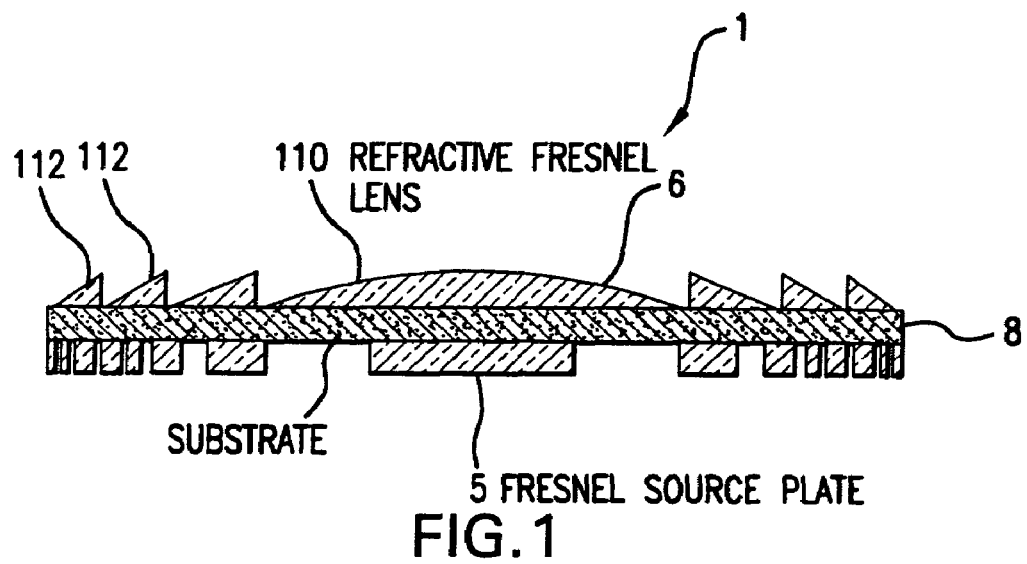
FIG. 1 is a side plan, cross sectional view of a compound optic or AFO.

FIG. 1 shows a compound optic or AFO 1, to which the present invention is applicable in one example.

The exemplary compound optic 1 comprises a diffractive Fresnel zone plate element 5 and one or more refractive Fresnel lens elements 6.

The compound optic 1 is shown fabricated on a single substrate 8. In practice, the different elements 5, 6 can also be fabricated on separated substrates, in other embodiments.

In the example in which the compound optic 1 is an. AFO, it includes a primary focusing element, which is the diffractive Fresnel zone plate 5, and chromatic dispersion compensating elements which is the refractive lenses 6. The refractive lens 6 compensates for the chromatic dispersion of the zone plate 5 but with no or very small focusing effect.

For micro-imaging applications involving short wavelength radiation, i.e., radiation in the wavelength range of 0.02 nanometers (nm) to 20 nm, the width of the segments in the refractive lens 6 typically range from many millimeters in the center segments 110 to below 1 micrometer near the edge segments 112. The profile accuracy required is about 10 nm and less. We will describe five methods that can be used to fabricate the required segments.

Ultra-High Precision Mechanical Machining

This method involves mechanical removal of material on a substrate in order to produce the desired lens profile.

Figure 2A:
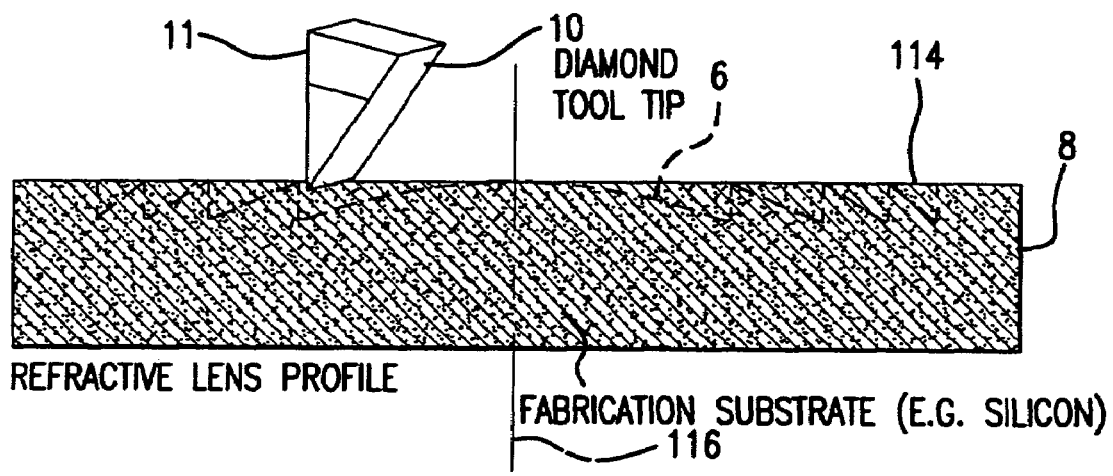
FIGS. 2A and 2B are side plan, cross sectional views illustrating the fabrication of the refractive element using mechanical removal of material on the substrate.
Figure 2B:
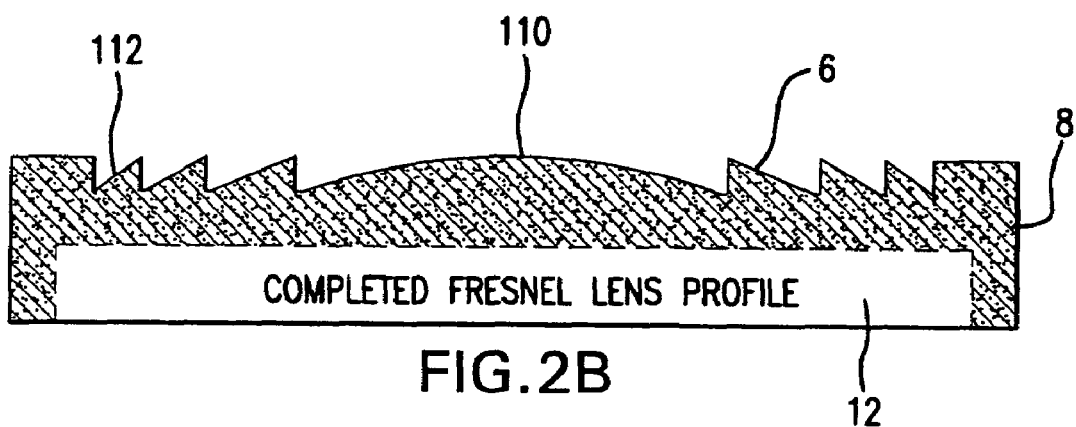

FIGS. 2A and 2B illustrate the fabrication of the refractive element 6 on an unpatterned substrate 8.

Specifically, FIG. 2A shows a sharp single-crystal diamond tool tip 10 of a diamond turning machine. The diamond tool tip 10 is controlled by a precision positioning system 11 and is driven along the surface 114 of the substrate 8. In one example, the substrate is silicon wafer material or copper. The tool 10 removes the material of the substrate 8 typically while the substrate is turned or rotated around a center axis 116 to thereby perform the cut.

As shown in FIG. 2B, once the surface profile 110, 112 is machined, the substrate 8 is typically thinned from the backside by removing the material in region 12 to thereby form an optical port to increase the transmission, if necessary. Finally, the second optical element, such as a diffractive zone plate element is then formed in the optical port 12, in one example.

The precision of diamond machining tools can be as high as 10 nm and are able to machine most materials required for the refractive lens, such as silicon and copper.

Lithographic Fabrication

This method involves patterning a photoresist, then developing the resist, and transferring the profile of the developed resist to the substrate 8. Two methods can be used with this technique.

Figure 3A:
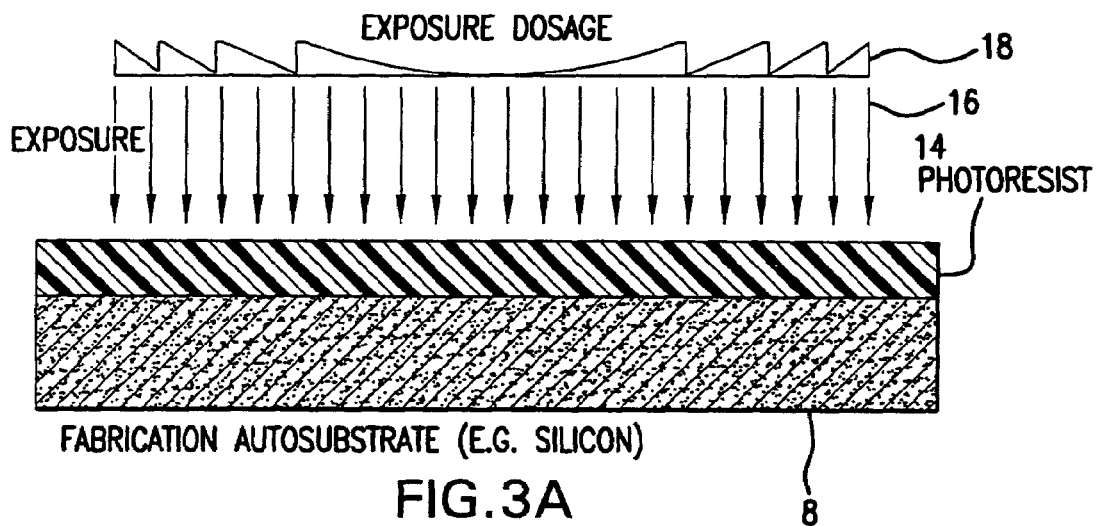
FIGS. 3A-3C are side plan, cross sectional views illustrating a gray-scale lithography method for the fabrication of the refractive element.
Figure 3B:
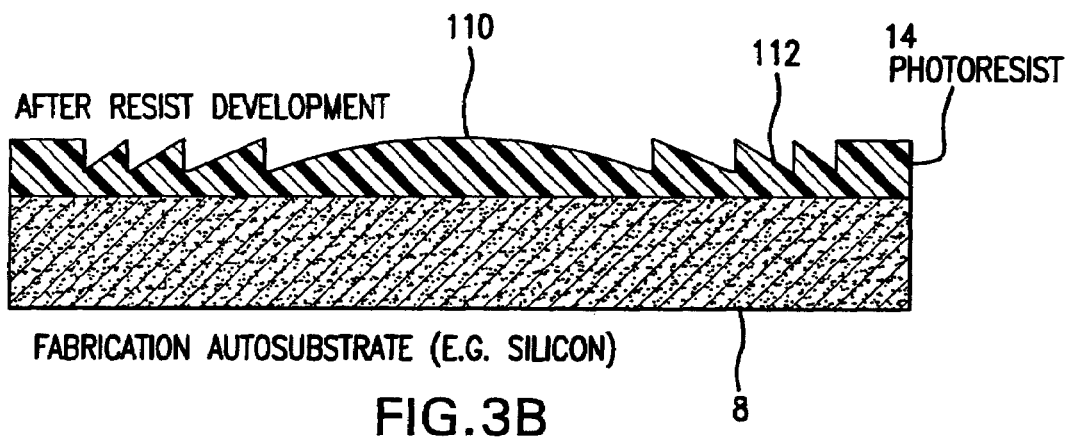
Figure 3C:
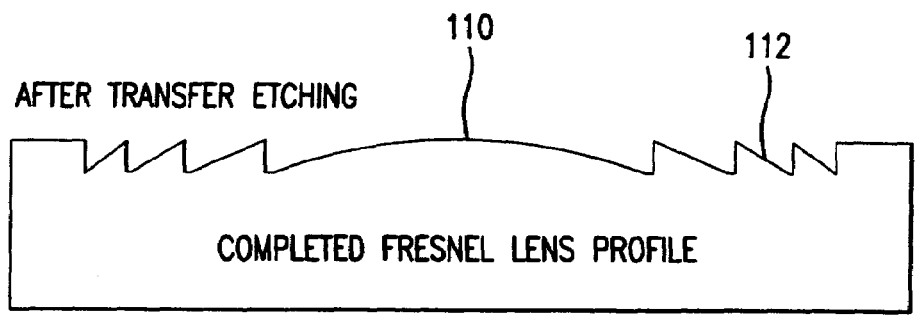

FIGS. 3A-3C show a gray-scale lithography method.

As shown in FIG. 3A, the substrate 8 is first coated with a layer of photoresist 14. Then, the photoresist 14 is exposed with a spatially varying dosage (see dosage exposure profile 18) that corresponds to the inverse of the desired surface profile.

Various types of exposure beams 16 can be used. Typically, the exposure beam is visible light, ultraviolet light, x-ray radiation, electrons and ions.

As shown in FIG. 3B, the resist 14 is then developed, yielding a profile 110, 112 similar to the desired surface pattern.

As shown in FIG. 3C, the substrate 8 is then etched in the transfer etching step to produce the desired surface profile in the substrate.

It should be noted that the response of the photoresist 14 in exposure, development, and the transfer etching is nonlinear. Therefore, careful calibration is required for high yields. This technique can produce resolution as high as tens of nanometers.

Finally, the diffractive element 5 formed on the backside of the substrate 8.

Figure 4A:
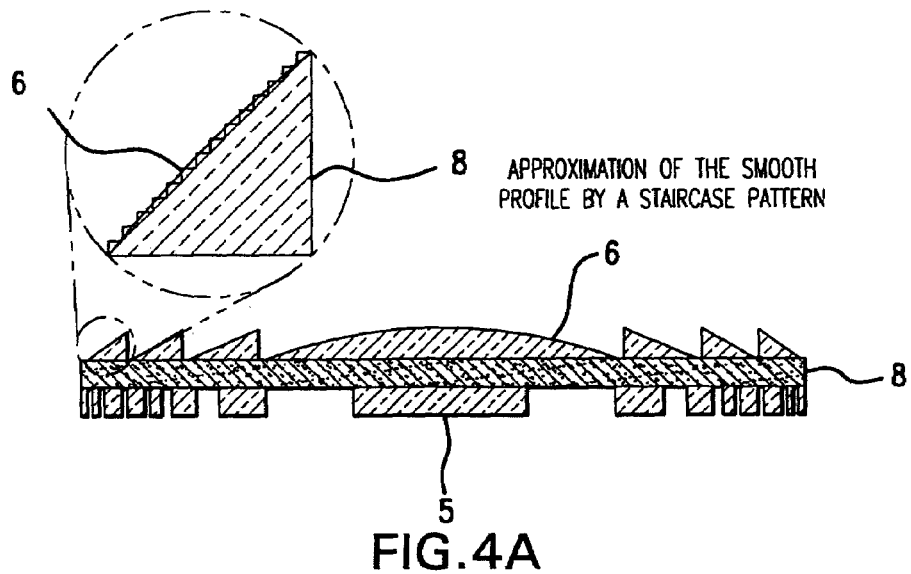
FIGS. 4A and 4B are side plan, cross sectional views illustrating a multi-step process for forming the refractive element.
Figure 4B:
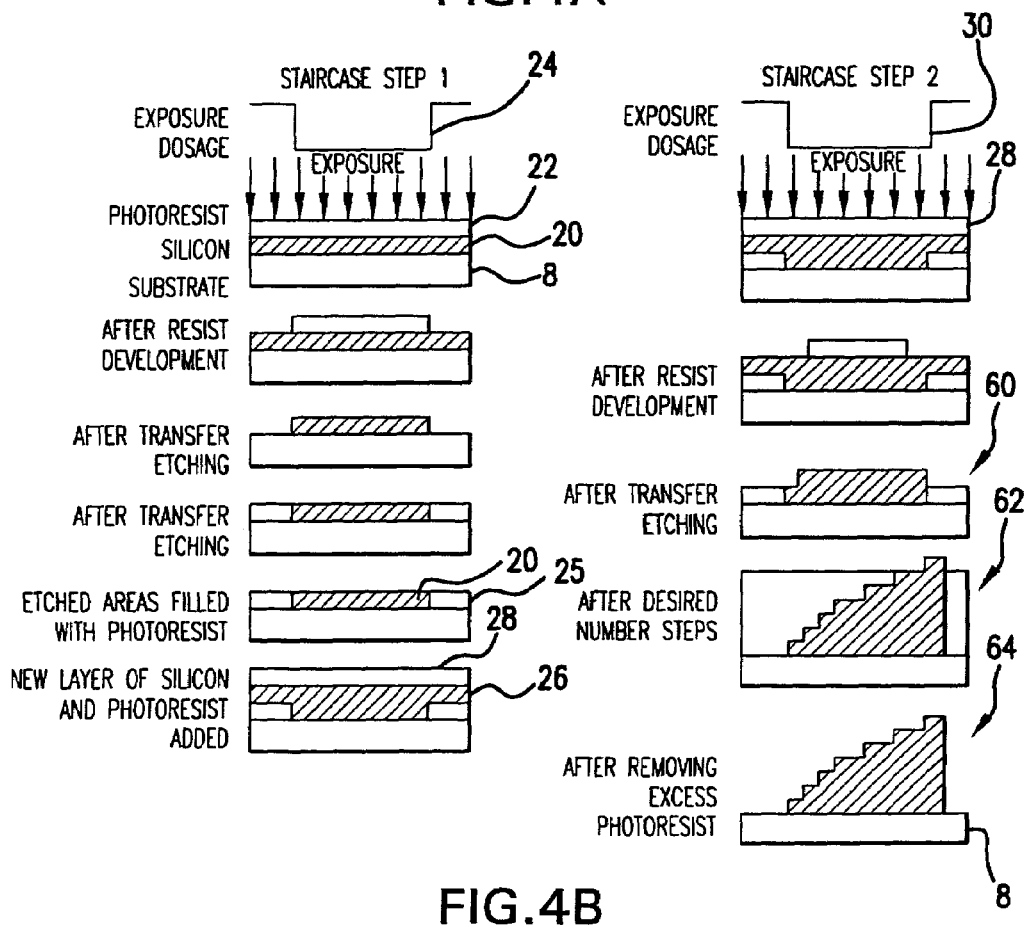

FIGS. 4A and 4B show an alternative method, using a multi-step process such as those used in semiconductor fabrication.

Here the smooth profile of the lens 6 needs to be approximated by a staircase pattern as shown in the FIG. 4A inset.

This is fabricated according to the following process as shown in FIG. 4B. A substrate 8 is first coated with a first layer of silicon 20 and then a layer of photoresist 22. An etch stop layer is typically located between the silicon layer 20 and the substrate 8. The photoresist 22 is exposed with a pattern (see exposure dosage profile 24) that corresponds to the lowest level of the staircase. After the resist 22 is developed, the first silicon layer 20 is etched to yield the lowest part of the staircase. The lens/substrate is then coated with, possibly, a thin etch stop layer and then resist 25 and polished to produce a flat surface, and then coated with another layer of silicon 26. Another layer of photoresist 28 is coated over this silicon layer 26 and exposed with a pattern that corresponds to the next level of the staircase (see exposure dosage profile 30). A two-level staircase pattern will be produced after the resisted is developed and the silicon layer is etched (see reference numeral 60). This process is repeated until the desired staircase profile is obtained (see reference 62). The result pattern is encased in photoresist, and removing the photoresist will produce the refractive lens (see reference 64). The substrate 8 can be thinned or removed to reduce absorption.

Finally, the diffractive element 5 is formed on the backside of the substrate 8.

High-Energy Beam Fabrication

Figure 5A:
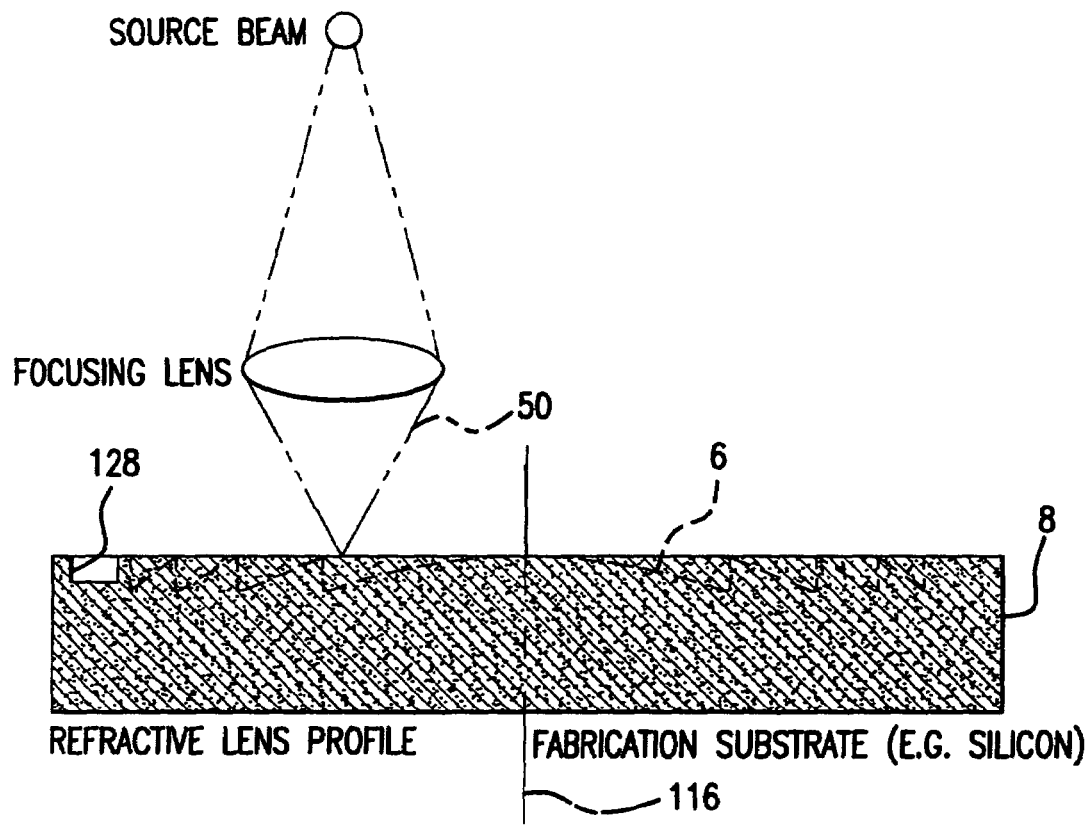
FIGS. 5A and 5B are side plan, cross sectional views illustrating a process for forming the refractive element using a high energy beam 50.
Figure 5B:
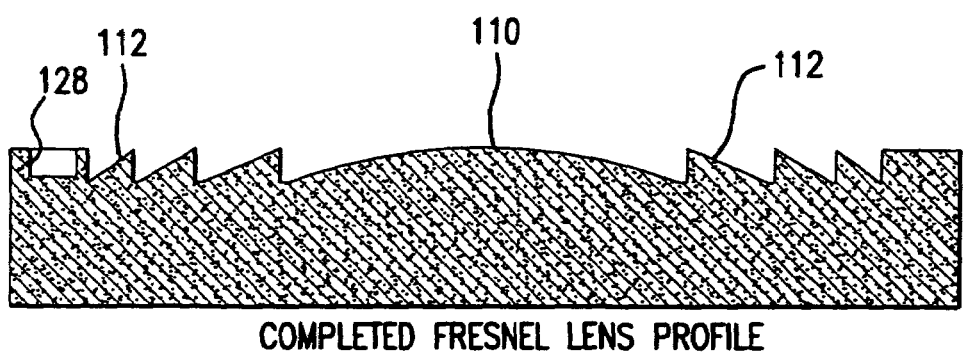

FIGS. 5A and 5B show a method in which a high energy beam 50 of, but not limited to, laser, electron, ion, and plasma is used to ablate material on the substrate.

Specifically, as shown in FIG. 5A, high energy beam 50 is directed and scanned over the substrate 8. Typically the beam 50 is a laser, electron, ion, and plasma beam that ablates material on the substrate surface. The relative movement between the beam and the substrate 8 is controlled, sometimes by rotating the substrate around its center axis in order to produce the desired profile 110, 112 as shown in FIG. 5B.

This method is analogous to the diamond-turning machine in that the lens profile is produced directly on the substrate 8 in a 1-step process, except that energetic particles are used instead of a solid tool tip. This method can achieve about 1 micrometer accuracy with lasers and better than 10 nm accuracy with a focused ion beam. The substrate 8 of the finished lens can be thinned from the back to reduce absorption, and the diffractive element 5 formed on the backside.

In the fabrication of the Fresnel refractive lens, the micromachining tools, such as focused ion beam milling, may need to be calibrated to fabricate the Fresnel lens with accurate linear dimensions, accurate depth profile, and without distortions.

For calibration, features, preferably linear scales 128, are first fabricated on the substrate 8 by a suitable, well-calibrated process. One such process is electron beam lithography, which is well understood. Features produced by the micromachining tool, such as 110, 112 are compared with the calibration features 128 to control and correct the calibration of the tool during the fabrication of those features.

Calibration features 128 in the form of linear scales in the plane of the lens or as trenches with an accurate depth profile for depth determination are preferably used.

Photo-Induced Chemical Etching

Figure 6A:
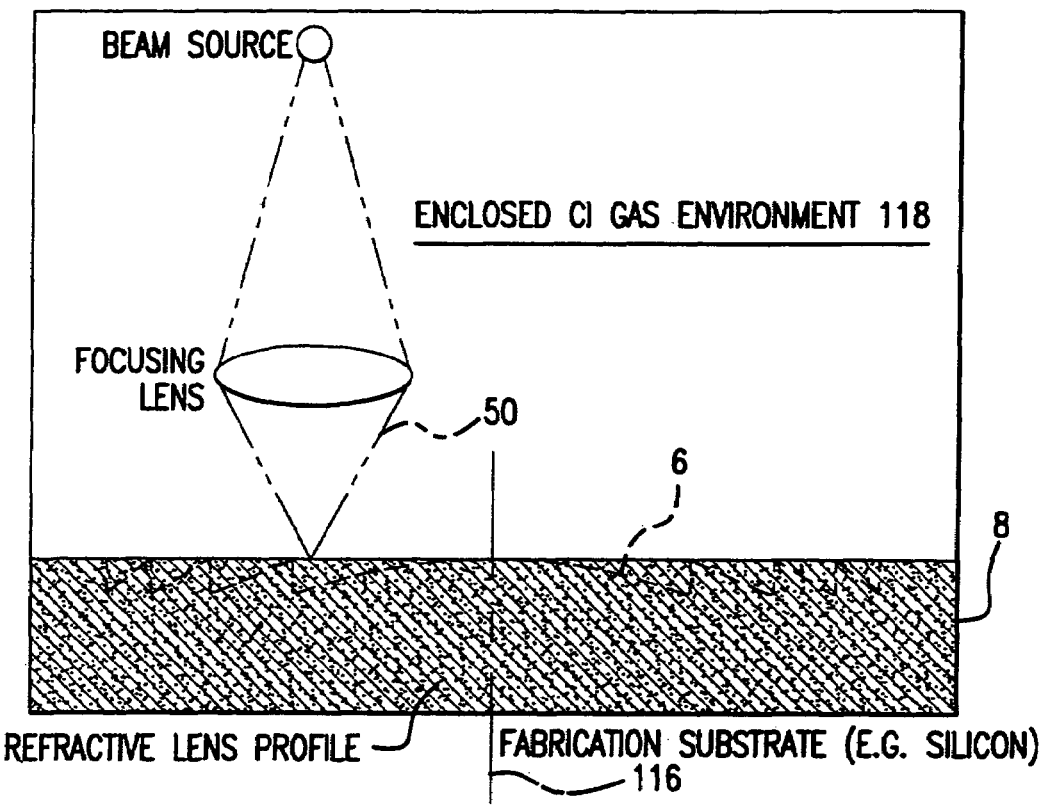
FIGS. 6A-6C are side plan, cross sectional views illustrating a process for forming the refractive element using photo-induced chemical etching.
Figure 6B:
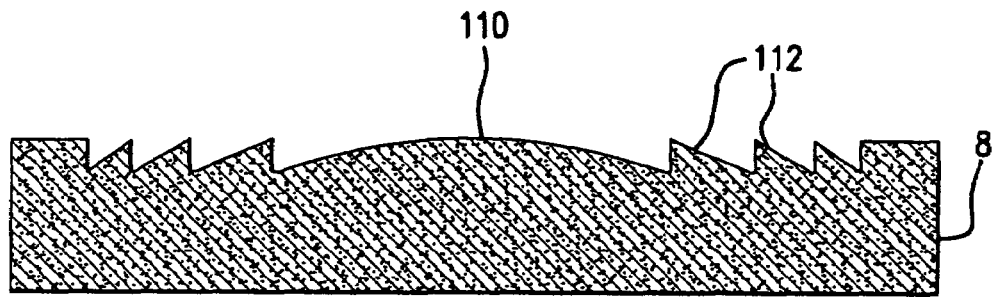
Figure 6C:
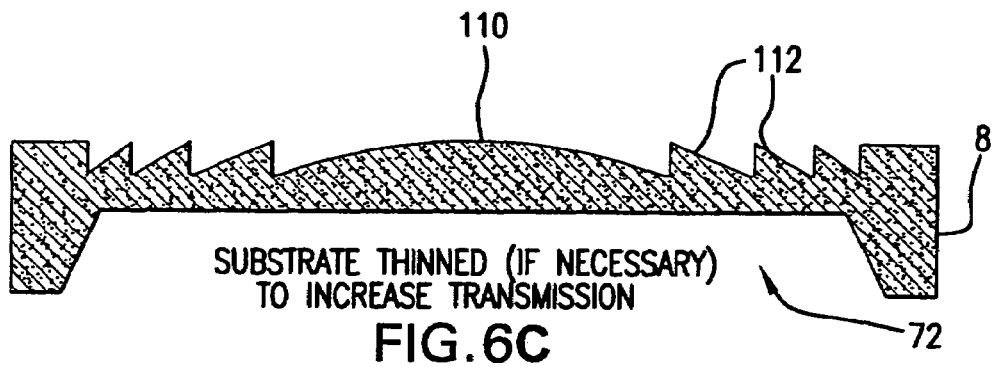

FIGS. 6A to 6C show a method for forming the refractive element 6 that takes advantage of the property that the etching rate of certain materials is dramatically increased when heated or in liquid state. As a non-limiting example, we assume a refractive lens 6 made of silicon.

Referring to FIG. 6A, the silicon substrate 8 is placed in a chlorine gas environment 118. A high-power laser spot 50 is then focused onto the surface of the silicon wafer 8 causing the surface to locally heat up and melt into a molten state. This causes the reaction rate with chlorine to increase twenty fold, and the molten zone is etched away at a much higher rate than the unheated region to yield the desired profile 110, 112 as shown in FIG. 6B. This method is capable of producing features with up to 1 micrometer (um) accuracy in the transverse direction and 10 nm in the longitudinal direction.

As shown in FIG. 6C, backside thinning is further performed in some implementations to produce an optical port 72 to improve transmission.

Alignment of the Lens Elements of the Compound Optic

Figure 7A:
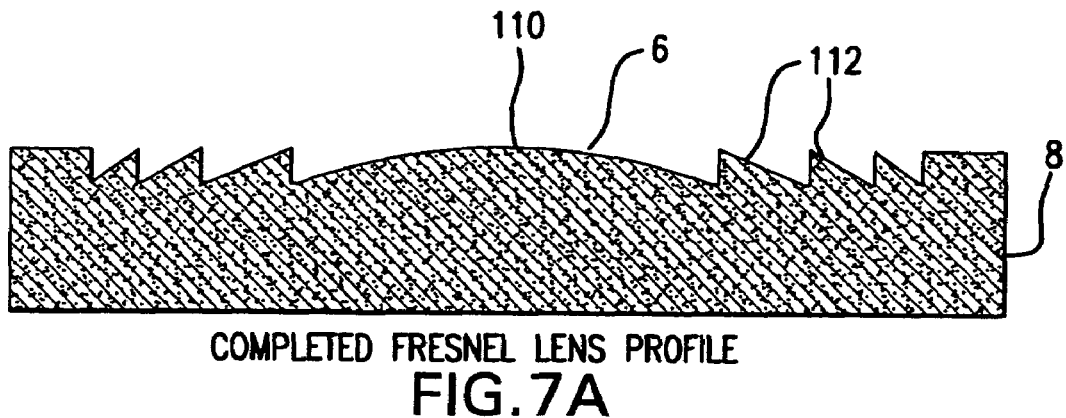
FIGS. 7A-7C are side plan, cross sectional views illustrating a process for aligning the diffractive zone plate element with the refractive Fresnel lens element.
Figure 7B:
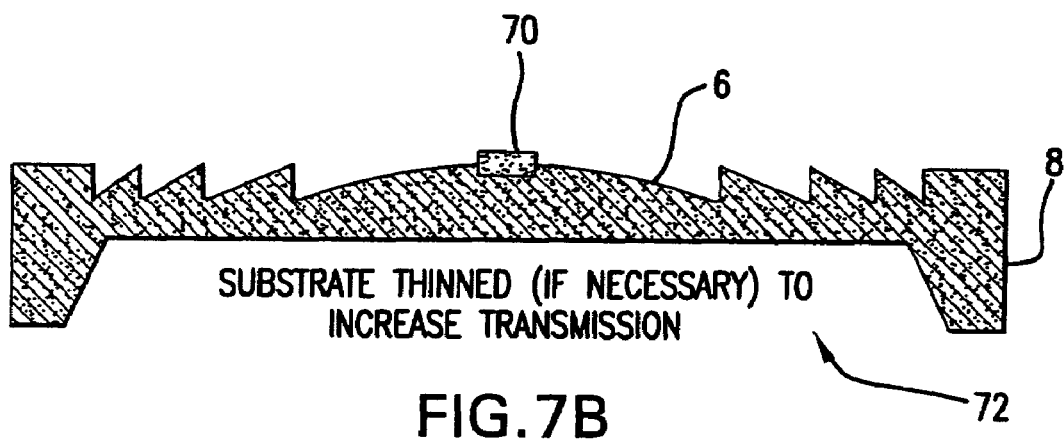
Figure 7C:
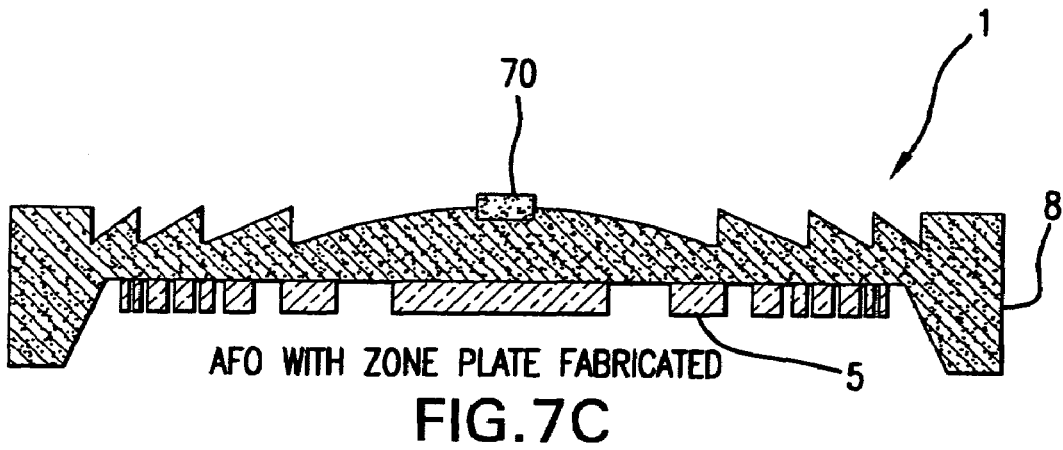

FIGS. 7A-7C shows the alignment of the lens elements of the compound optic 1.

As shown in FIG. 7A, the process begins typically with the first, refractive lens element 6, which has been fabricated according to one of the previously defined processes.

The preferred method of aligning the zone plate 5 and the refractive lens 6 is to fabricate them on the same substrate 8. As a non-limiting example, we will assume the refractive lens 6 is fabricated from silicon as shown in FIG. 7A.

As shown in FIG. 7B, a fiducial mark 70 is added to the refractive lens 6. Specifically, in the example, the fiducial 70 is added to the center of the lens 6. In practice, the placement of multiple fiducials can lead to higher accuracy.

Since the AFO is a transmissive lens, it is often advantageous to thin the substrate 8 to thereby fabricate an optical port 72. This reduces absorption.

Once the substrate 8 is thinned to below 1 micrometer (um) in one implementation, the fiducial 70 can be imaged from the opposite side with a number of techniques, including but not limited to visible light. The zone plate element 5 is then fabricated in the optical port 72 such that it is centered at the fiducial mark 70. The accuracy of the fiducial alignment can be on the order of tens of nanometers.

Hybrid Fabrication Techniques

Figure 8:
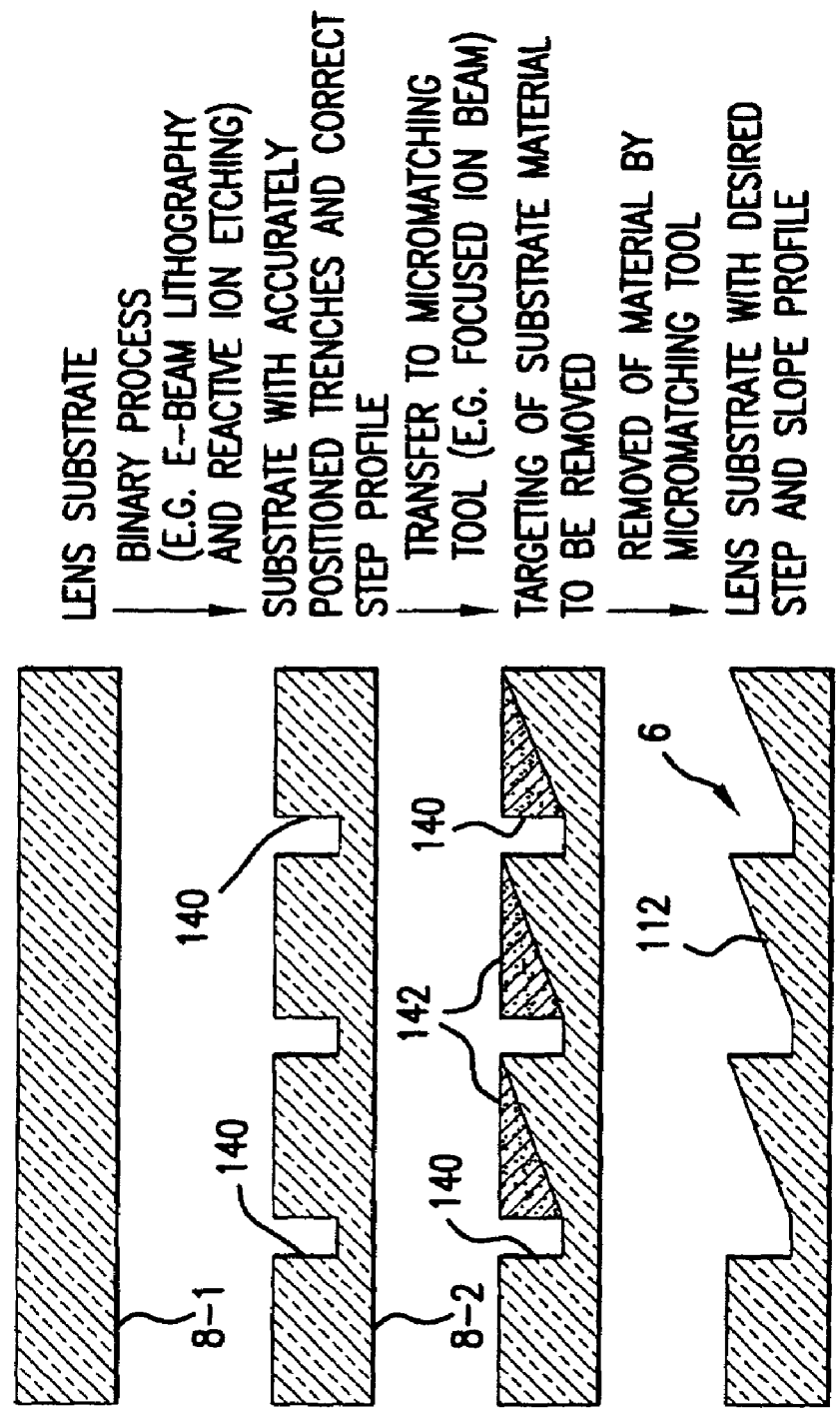
FIG. 8 is a side plan, cross sectional view illustrating a process for fabricating the refractive Fresnel lens element using a hybrid fabrication solution.

FIG. 8 illustrates a hybrid fabrication process for fabrication of the refractive element 6. Generally, in practice, it may prove advantageous to use a combination of different patterning techniques to fabricate the desired profile 110, 112 of the Fresnel refractive lens 6.

In the illustrated example, a binary process, such as electron beam lithography is first used to fabricate a pattern of concentric trenches 140 in the unpatterned substrate 8-1. This produces a binary-patterned substrate 8-2. Specifically, the binary pattern of concentric trenches represents the desired step function of the desired Fresnel lens.

A suitable micromaching process, such as focused ion beam milling, is subsequently used to produce the desired profile between steps.

Specifically, substrate material for removal 142 is targeted between the trenches 140. The targeted material 142 is then removed using the focused ion beam 50. This yield the desired profile 112 for refractive element 6.

This approach has the advantage of combining the high-resolution patterning accuracy and depth control of electron beam lithography with the machining capabilities of focused ion beam milling. The gradual profile between zones is machined by focused ion beam milling, while it is extremely difficult to machine a vertical step with a great depth, which is accomplished with binary process, such as lithography.

Figure 9:
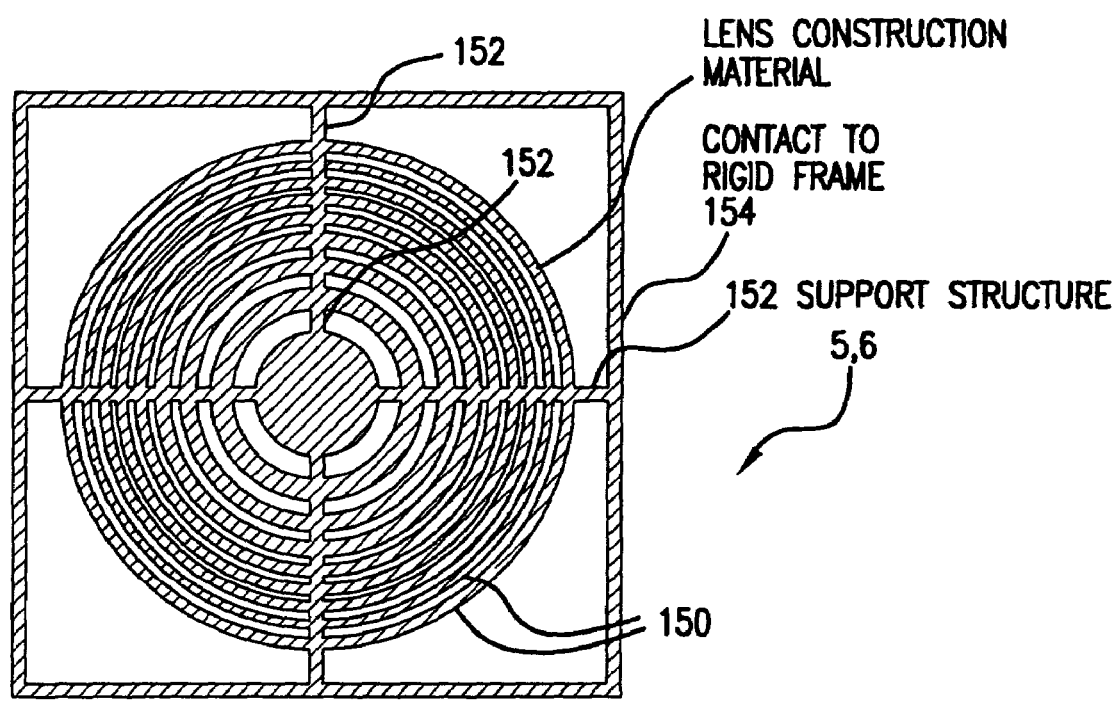
FIG. 9 is a schematic plan view of a free standing zone plate lens element according to the invention.

FIG. 9 shows another embodiment of the diffractive or refractive element 5, 6. Specifically, the AFO 1 can be also realized by combining a free-standing Fresnel lens and/or a free-standing zone plate lens to reduce absorptive loss.

The free-standing zone plate and Fresnel lens are realized by addition of a support structure. In the illustrate example, radial spokes 152 are included with the typical pattern of concentric rings 150 associated with the zone plate 5 or Fresnel lens 6. The spokes 152 connect and support the rings 150 and further connect the rings 150 to a surrounding frame 154. Often the spokes are fabricated out of the same material (e.g., silicon or copper), and with the fabrication of rings. The spokes need not be continuous as shown but interrupted, such that only segments extend, at least partially in the radial direction, between each successive rings. In this way, all of the rings are connected through a series of spoke segments.

Typically a substrate support, which is needed for the fabrication, is removed in the final step leaving only self-supporting optical element 5, 6.

Common features in the support structure of the zone plate and the Fresnel lens can be used as fiducial markers to align both optical elements in respect to each other.

While this invention has been particularly shown and described with references to preferred embodiments thereof, it will be understood by those skilled in the art that various changes in form and details may be made therein without departing from the scope of the invention encompassed by the appended claims. For example, typical scanning electron microscopes (SEM) have X-ray detectors (EDAX), which are used to identify materials being imaged. In the fluorescence spectrometer mode, the present invention is used as an element specific imaging attachment to a SEM.

What is claimed is:

1. A method for fabricating a compound optic for short wavelength radiation, the method comprising:
   removing material of a substrate to form a surface profile of a first optical element of the compound optic;
   thinning the substrate on a side of the substrate opposite the surface profile to form an optical port on a backside of the substrate; and
   forming a zone plate lens of the compound optic on the substrate in the optical port.

2. A method as claimed in claim 1, wherein the step of removing the material comprises applying a tool tip of a turning machine to the substrate to mechanically remove the material.

3. A method as claimed in claim 1, wherein the step of removing the material comprises directing a beam at the substrate.

4. A method as claimed in claim 3, further comprising forming calibration features in the substrate.

5. A method as claimed in claim 4, further comprising forming the calibration features by electron beam lithography.

6. A method as claimed in claim 4, wherein the calibration features comprise linear scales in the plane of the first optical element.

7. A method as claimed in claim 4, wherein the calibration features comprise trenches extending into the substrate.

8. A method as claimed in claim 4, further comprising forming trench calibration features in the substrate prior to the step of directing the beam at the substrate.

9. A method as claimed in claim 8, wherein the trenches are formed by lithography.

10. A method as claimed in claim 8, wherein the trenches set the desired step profile for the first optical element.

11. A method as claimed in claim 3, wherein the step of directing a beam comprises directing a laser beam at the substrate to ablate the material.

12. A method as claimed in claim 3, wherein the step of directing a beam comprises directing an electron beam at the substrate to ablate the material.

13. A method as claimed in claim 3, wherein the step of directing a beam comprises directing an ion beam at the substrate to ablate the material.

14. A method as claimed in claim 3, wherein the step of directing a beam comprises directing a plasma beam at the substrate to ablate the material.

15. A method as claimed in claim 1, wherein the step of removing the material comprises etching into the substrate through a patterned resist layer to transfer a pattern of the resist layer into the substrate.

16. A method as claimed in claim 1, wherein the step of removing the material comprises selectively reacting a surface of the substrate to remove the material.

17. A method as claimed in claim 16, wherein the step of selectively reacting the surface comprises directing a laser beam at the surface through a chlorine atmosphere.

18. A method as claimed in claim 1, further comprising forming a fiducial mark on the substrate; and forming the zone plate lens of the compound optic by reference to the fiducial mark.

19. A method as claimed in claim 1, wherein the first optical element is a refractive optical element.

20. A method as claimed in claim 1, wherein the first optical element is a refractive Fresnel optical element.

21. A method for fabricating a compound optic for short wavelength radiation, the method comprising:
    forming a surface profile of a first optical element of the compound optic on a substrate;
    forming a fiducial mark on the substrate; and
    forming a second optical element of the compound optic by reference to the fiducial mark; and
    thinning the substrate on a side of the substrate opposite the surface profile to form an optical port on a backside of the substrate.

22. A method as claimed in claim 21, wherein the step of forming the second optical element comprises forming the second optical element in the optical port.

23. A method as claimed in claim 22, wherein the step of forming the second optical element comprises forming a zone plate lens.

24. A method as claimed in claim 21, wherein the step of forming the second optical element comprises forming a zone plate lens.

25. A method as claimed in claim 21, wherein the step of forming the second optical element comprises forming the second optical element in the optical port.

26. A method as claimed in claim 21, wherein the step of forming the second optical element comprises forming a zone plate lens in the optical port.

27. A method as claimed in claim 26, wherein the first optical element is a refractive optical element.

28. A method as claimed in claim 26, wherein the first optical element is a refractive Fresnel optical element.

* * * * *

UNITED STATES PATENT AND TRADEMARK OFFICE
CERTIFICATE OF CORRECTION

PATENT NO. : 7,365,909 B2 Page 1 of 1
APPLICATION NO. : 10/688187
DATED : April 29, 2008
INVENTOR(S) : Wenbing Yun et al.

It is certified that error appears in the above-identified patent and that said Letters Patent is hereby corrected as shown below:

On the Title page of the patent at Item (54) Title, change "COMPOUNDS" to --COMPOUND--.

Signed and Sealed this

Twenty-sixth Day of August, 2008

JON W. DUDAS
*Director of the United States Patent and Trademark Office*

UNITED STATES PATENT AND TRADEMARK OFFICE
CERTIFICATE OF CORRECTION

PATENT NO. : 7,365,909 B2 Page 1 of 1
APPLICATION NO. : 10/688187
DATED : April 29, 2008
INVENTOR(S) : Wenbing Yun et al.

It is certified that error appears in the above-identified patent and that said Letters Patent is hereby corrected as shown below:

On the Title page of the patent at Item (54) and Column 1, line 2, Title, change "COMPOUNDS" to --COMPOUND--.

This certificate supersedes the Certificate of Correction issued August 26, 2008.

Signed and Sealed this

Sixteenth Day of September, 2008

JON W. DUDAS
*Director of the United States Patent and Trademark Office*